(12) United States Patent
Schrenker et al.

(10) Patent No.: US 6,503,322 B1
(45) Date of Patent: Jan. 7, 2003

(54) ELECTRICAL RESISTANCE HEATER AND METHOD FOR CRYSTAL GROWING APPARATUS

(75) Inventors: Richard G. Schrenker, Chesterfield, MO (US); William L. Luter, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 91 days.

(21) Appl. No.: 09/691,994

(22) Filed: Oct. 19, 2000

Related U.S. Application Data (62) Division of application No. 09/338,826, filed on Jun. 23, 1999, now abandoned.
(60) Provisional application No. 60/090,798, filed on Jun. 26, 1998.

(51) Int. Cl.[7] .............................................. C30B 15/14
(52) U.S. Cl. ...................................................... 117/204
(58) Field of Search .................................. 117/200, 204

(56) References Cited

U.S. PATENT DOCUMENTS

| | | |
|---|---|---|
| 4,597,949 A | 7/1986 | Jasinski et al. |
| 4,604,262 A | 8/1986 | Nishizawa |
| 4,783,235 A * | 11/1988 | Morioka et al. ......... 156/620.2 |
| 4,857,278 A * | 8/1989 | Gevelber et al. ........... 422/249 |
| 4,863,554 A | 9/1989 | Kawasaki et al. |
| 4,973,377 A | 11/1990 | Katsuoka et al. |
| 4,981,549 A | 1/1991 | Yamashita et al. |
| 5,248,378 A | 9/1993 | Oda et al. |
| 5,575,847 A | 11/1996 | Kuramochi et al. |
| 5,667,584 A | 9/1997 | Takano et al. |
| 5,779,791 A | 7/1998 | Korb et al. |
| 5,824,149 A | 10/1998 | Li |
| 5,840,120 A | 11/1998 | Kim et al. |
| 5,935,326 A | 8/1999 | Kotooka et al. |
| 5,968,262 A | 10/1999 | Saishouji et al. |
| 5,968,264 A * | 10/1999 | Iida et al. ..................... 117/30 |
| 6,007,625 A | 12/1999 | Tomioka et al. |
| 6,071,337 A * | 6/2000 | Sakurada et al. ............. 117/13 |

FOREIGN PATENT DOCUMENTS

| | | |
|---|---|---|
| EP | 0 504 837 A2 | 9/1992 |
| EP | 0 716 168 A1 | 6/1996 |
| EP | 0 823 497 A1 | 2/1998 |
| JP | 58-120591 | 7/1983 |
| JP | 61-201692 | 9/1986 |
| JP | 03-093700 | 4/1991 |
| JP | 05-043385 | 2/1993 |
| JP | 06-087686 | 3/1994 |
| JP | 06-092780 | 4/1994 |
| JP | 08-012493 | 1/1996 |
| JP | 10-139600 | 5/1998 |

OTHER PUBLICATIONS

Hourai, et al.; Oxygen Precipitation Behavior in Silicon During Czochralski Crystal Growth; Silicon Technology R & D Center (undated).

* cited by examiner

Primary Examiner—Benjamin L. Utech
Assistant Examiner—Matthew Anderson
(74) Attorney, Agent, or Firm—Senniger, Powers, Leavitt & Roedel

(57) ABSTRACT

An electrical resistance heater for use in a crystal puller used for growing monocrystalline silicon ingots according to the Czochralski method comprises a heating element sized and shaped for placement in a housing of the crystal puller generally above a crucible in spaced relationship with the outer surface of the growing ingot for radiating heat to the ingot as it is pulled upward in the housing relative to the molten silicon. The heating element has an upper end and a lower end. The lower end of the heating element is disposed substantially closer to the molten silicon than the upper end when the heating element is placed in the housing. The heating element is constructed such that the heating power output generated by the heating element gradually increases from the lower end to the upper end of the heating element.

10 Claims, 5 Drawing Sheets

ELECTRICAL RESISTANCE HEATER AND METHOD FOR CRYSTAL GROWING APPARATUS

CROSS-REFERENCE TO RELATED APPLICATIONS

This application is a divisional of U.S. patent application Ser. No. 09/338,826, filed Jun. 23, 1999, now abandoned, which claims the benefit of U.S. Provisional Patent Application 60/090,798, filed Jun. 26, 1998, all of which are herein incorporated by reference in their entirety for all purposes.

BACKGROUND OF THE INVENTION

The present invention relates generally to crystal growing apparatus used in growing monocrystalline ingots, and more particularly to an electrical resistance heater for use in such a crystal growing apparatus.

Single crystal silicon, which is the starting material for most semiconductor electronic component fabrication, is commonly prepared by the so-called Czochralski ("Cz") method. The growth of the crystal is most commonly carried out in a crystal pulling furnace. In this method, polycrystalline silicon ("polysilicon") is charged to a crucible and melted by a heater surrounding the outer surface of the crucible side wall. A seed crystal is brought into contact with the molten silicon and a single crystal ingot is grown by slow extraction via a crystal puller. After formation of a neck is complete, the diameter of the crystal ingot is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

Heaters used for melting source material (e.g. silicon) in the crucible are typically electrical resistance heaters in which an electrical current flows through a heating element constructed of a resistive heating material (e.g., graphite). The resistance to the flow of current generates heat that radiates from the heating element to the crucible and silicon contained therein. The heating element comprises vertically oriented heating segments of equal length and cross-section arranged in side-by-side relationship and connected to each other in a serpentine configuration. That is, adjacent segments are connected to each other at the tops or bottoms of the segments in an alternating manner to form a continuous electrical circuit throughout the heating element. The heating power generated by the heating element is generally a function of the cross-sectional area of the segments.

Although the conventional apparatus used for growing single crystal ingots according to the Czochralski growth method has been satisfactory for growing crystal ingots useful in a wide variety of applications, further improvements in the quality of the semiconductor material are desirable. As the width of integrated circuit lines formed on the semiconductor material continue to be reduced, the presence of defects in the crystal become of greater concern. A number of defects in single crystal silicon form in the crystal growth chamber as the crystal cools after solidification. Such defects arise, in part, because of the presence of an excess (i.e., a concentration above the solubility limit) of intrinsic point defects, which are known as vacancies and self-interstitials. It has been suggested that the type and initial concentration of these point defects in the crystal ingot are determined at the time of solidification and, if these concentrations reach a level of critical supersaturation in the system and mobility of point defects is sufficiently high, a reaction, or an agglomeration event, will likely occur.

One important measurement of the quality of wafers sliced from a single-crystal ingot is Gate Oxide Integrity ("GOI"). Vacancies, as their name suggests, are caused by the absence or "vacancy" of a silicon atom in the crystal lattice. When the crystal is pulled upward from the molten silicon in the crucible, it immediately begins to cool. As the temperature of the crystal ingot descends through the temperature range of 1150° C. down to 1050° C., vacancies present in the ingot tend to migrate out toward the outer surface of the ingot or agglomerate together within the ingot. These agglomerations are manifested as pits within the surfaces of the wafers sliced from the crystal ingot.

Silicon wafers sliced from the ingot and manufactured according to conventional processes often include a silicon oxide layer formed on the surface of the wafer. Electronic circuit devices such as MOS devices are fabricated on this silicon oxide layer. Defects in the surface of the wafer, caused by the agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The Gate Oxide Integrity (GOI) of the crystal is the percentage of operational devices on the oxide layer of the wafers processed from the crystal.

It has been determined that the GOI of crystals grown by the Czochralski method can be improved by increasing the amount of time a growing ingot dwells in the temperature range above 1000° C., and more particularly in the range of 1150° C.–1000° C. If the ingot cools too quickly through this temperature range, the vacancies will not have sufficient time to agglomerate together, resulting in a large number of small agglomerations within the ingot. This undesirably leads to a large number of small pits spread over the surfaces of the wafer, thereby negatively affecting GOI. Slowing down the cooling rate of the ingot so that its temperature dwells in the target temperature range for a longer period of time allows more vacancies to move to the outer surface of the ingot or form large agglomerations within the ingot. The result is a small number of large agglomerations, thereby improving GOI by decreasing the number of defects present in the surface of the wafer upon which the MOS devices are formed.

Defects relating to self-interstitials are less well studied. They are generally regarded as being low densities of interstitial-type dislocation loops or networks. Such defects are not responsible for GOI failures, but they are widely recognized as the cause of other types of device failures usually associated with current leakage problems. It has been determined that the agglomeration of self-interstitials are undesirable and can be controlled by increasing the amount of time a growing ingot dwells in the temperature range above 1000° C. As portions of the ingot remain at temperatures above 1000° C. for relatively long time durations, radial out-diffusion of self-interstitials from the ingot occurs to suppress the concentration below the critical concentration required for agglomeration of interstitial defects.

To these ends, U.S. Pat. No. 5,248,378 (Oda et al.) discloses an apparatus for producing single silicon crystal in which a passive heat insulator is disposed in the crystal puller above the crucible to reduce the rate of cooling of the growing ingot above 1150° C. However, heat insulators or heat shields such as that disclosed by Oda et al. generally cannot slow the cooling of the ingot to a rate sufficient to substantially improve the GOI of the crystal or suppress the agglomeration of interstitial defects.

Oda et al. further disclose that the insulator may be replaced by a heater for heating the growing ingot. While a heater similar to the conventional crucible heater described above would more actively apply heat to the ingot to reduce the cooling rate, using such a heater has a number of disadvantages. For example, the heating power output of the conventional heater is generally constant along the height of the heater. A crystal ingot being pulled upward through the heater would be rapidly heated at the bottom of the heater to reduce the cooling rate of the ingot. The cooling rate would continue to decrease as the ingot passed upward through the heater and then increase upon reaching the top of the heater. For example, a plot of the axial temperature gradient of the ingot versus the ingot temperature would look similar to that shown in FIG. 5 for an ingot grown without a secondary heater, but the axial temperature gradient would be substantially reduced throughout the temperature range of 1150° C.–1000° C. including the valley. Thus, such a heater is capable of reducing the cooling rate, or axial temperature gradient, of the growing ingot, but it cannot control the uniformity of the axial temperature gradient because the heat generated by the heater is uniform along the length of the heater. By significantly reducing the cooling rate of the heater to a defined valley, it will take an undesirably long time for the cooling rate to increase once the ingot cools to a temperature of 1000° C.

There is a need, therefore, for a heater that can be used to both reduce the cooling rate of the growing ingot above 1000° C. and control the uniformity of the axial temperature gradient of the ingot in the range of 1150° C.–1000° C., and more particularly in the range of 1100° C.–1000° C.

SUMMARY OF THE INVENTION

Among the several objects and features of the present invention may be noted the provision of an electrical resistance heater for use in a crystal puller which facilitates the growth of crystals having an improved Gate Oxide Integrity; the provision of such a heater which provides a more uniform axial temperature gradient in the range of 1100° C.–1000° C.; the provision of such a heater which increases the dwell time of the ingot at a temperature above 1000° C.; the provision of such a heater which increases the dwell time of the ingot temperature in the range of 1100° C. to 1000° C.; and the provision of such a heater which facilitates reduction of agglomeration of intrinsic point defects.

Generally, an electrical resistance heater of the present invention for use in a crystal puller used for growing monocrystalline silicon ingots according to the Czochralski method comprises a heating element sized and shaped for placement in the housing of the crystal puller generally above the crucible in spaced relationship with the outer surface of the growing ingot for radiating heat to the ingot as it is pulled upward in the housing relative to the molten silicon. The heating element has an upper end and a lower end. The lower end of the heating element is disposed substantially closer to the molten silicon than the upper end when the heating element is placed in the housing. The heating element is constructed such that the heating power output generated by the heating element gradually increases from the lower end to the upper end of the heating element.

In another embodiment, a method of controlling the uniformity of the axial temperature gradient of a monocrystalline silicon ingot grown in a crystal puller used for growing monocrystalline silicon ingots according to the Czochralski method comprises allowing the ingot to cool to a predetermined first temperature as it is pulled upward in the housing from the molten silicon. Heat is radiated to the ingot as it is pulled further upward in the housing to reduce the cooling rate of the ingot as it cools down from the first temperature. The amount of heat radiated to the ingot is gradually increased as the ingot is pulled further upward in the housing to maintain a generally uniform axial temperature gradient of the ingot as the temperature of the ingot decreases from the first temperature down to a predetermined second temperature.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
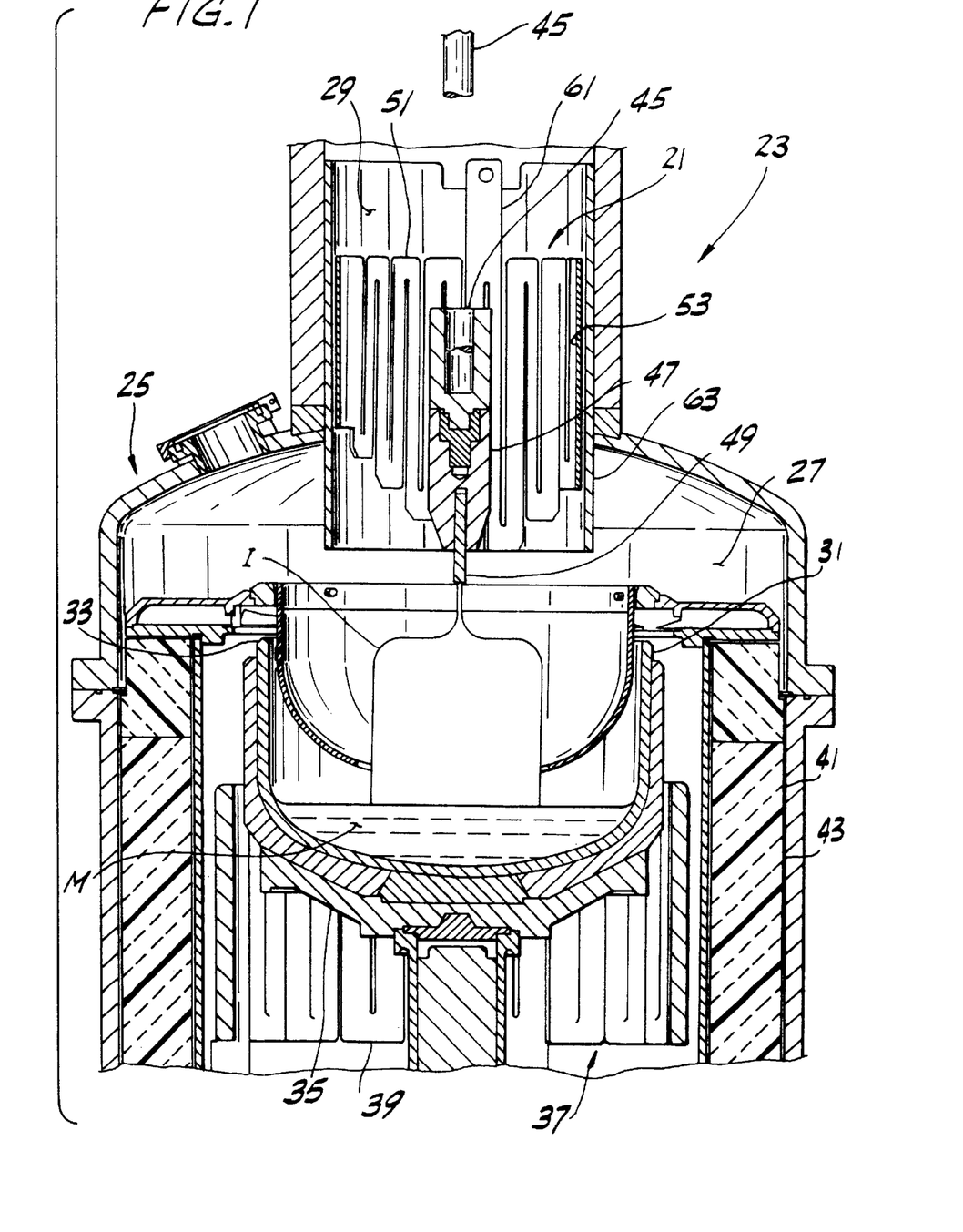
FIG. 1 is a schematic, fragmentary vertical section of a crystal puller showing an electrical resistance heater of a first embodiment as it is positioned during growth of a single crystal silicon ingot.

Referring now to the drawings and in particular to FIG. 1, an electrical resistance heater constructed according to the principles of the present invention is generally indicated at 21. The heater is preferably for use in a crystal puller, indicated generally at 23, of the type used to grow monocrystalline silicon ingots (e.g., ingot I of FIG. 1) according to the Czochralski method. The crystal puller 23 includes a housing (generally indicated at 25) for isolating an interior which includes a lower crystal growth chamber 27 and an upper pull chamber 29. The pull chamber 29 has a smaller transverse dimension than the growth chamber. A quartz crucible 31 contains molten semiconductor source material M from which the monocrystalline silicon ingot I is grown. The crucible 31 includes a cylindrical side wall 33 and is mounted on a turntable 35 for rotation about a vertical axis. The crucible 31 is also capable of being raised within the growth chamber 27 to maintain the surface of the molten source material M at the same level as the ingot I is grown and source material is removed from the melt.

A crucible heater, generally indicated at 37, for melting the source material M in the crucible 31 includes a generally vertically oriented heating element 39 surrounding the crucible in radially spaced relationship with the side wall 33 of the crucible. The heating element 39 heats the crucible 31 and the interior of the crystal puller housing 25 to temperatures above the melting point of the source material M (e.g., silicon). Insulation 41 is positioned to confine the heat to the interior of the housing 25. In addition, there are passages in the housing, including the wall of the upper pull chamber, for circulation of cooling water. Some of these passages are designated by the reference numeral 43 in FIG. 1.

A pulling mechanism includes a pull shaft 45 extending down from a mechanism (not shown) above the pull chamber 29 capable of raising, lowering and rotating the pull shaft. The crystal puller 23 may have a pull wire (not shown) rather than a shaft 45, depending upon the type of puller. The pull shaft 45 terminates in a seed crystal chuck 47 which holds a seed crystal 49 used to grow the monocrystalline ingot I. The pull shaft 45 has been partially broken away in FIG. 1 for clarity in illustration of a raised position of the seed chuck 47 and ingot I. The general construction and operation of the crystal puller 23, except to the extent explained more fully below, is well known to those of ordinary skill in the art and will not be further described.

The electrical resistance heater 21 of the present invention comprises a generally tubular heating element 51 mounted in the upper pull chamber 29 of the housing 25 adjacent the dome-shaped upper wall of the lower growth chamber 27. The heating element 51 extends downward into the crystal growth chamber 27, terminating substantially above the crucible 31 containing the molten source material M. A central opening 53 of the heating element 51 allows the growing ingot I to pass centrally through the heating element as it is pulled upward through the housing 25 of the puller 23.

Figure 2:
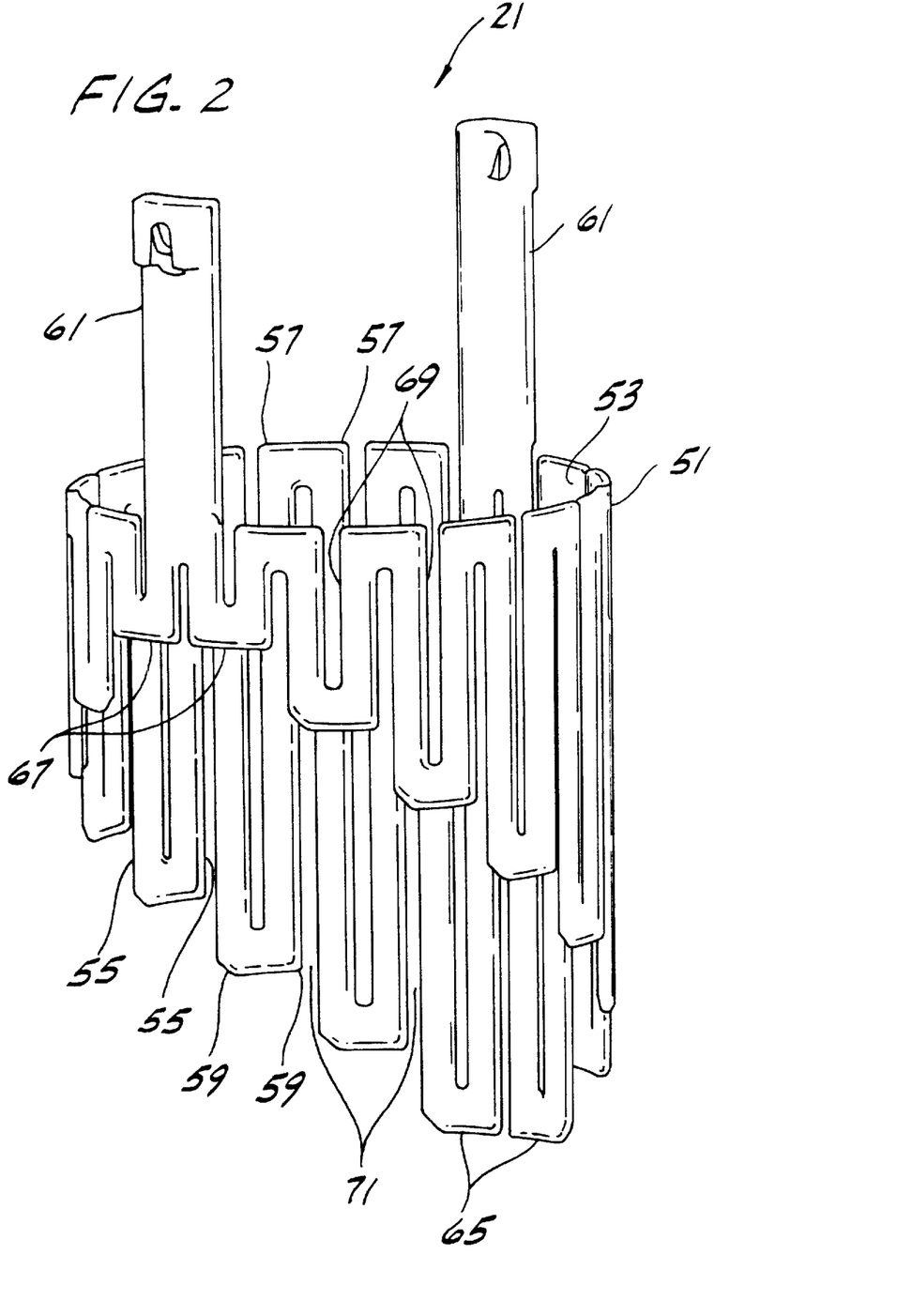
FIG. 2 is a perspective view of the electrical resistance heater.

As shown in FIG. 2, the heating element 51 comprises vertically oriented heating segments 55 arranged in side-by-side relationship and connected to each other to form an electrical circuit. More particularly, upper and lower ends, designated 57 and 59, respectively, of adjacent heating segments 55 are alternatingly connected to each other in a continuous serpentine configuration forming a closed geometric shape; in the illustrated embodiment, a cylinder. Opposing mounting brackets 61 are connected to the top of the heating element 51 in electrical connection with the heating segments 55 and extend upward from the heating element for mounting the heater 21 on the wall of the upper pull chamber 29. Openings (not shown) in the wall of the upper pull chamber 29 allow the mounting brackets 61 to be electrically connected to a source of electrical current (not shown) by conventional electrodes (not shown) extending through the openings for connection with the mounting brackets to conduct current through the heating element 51. A tubular heat shield 63, preferably constructed of graphite, graphite insulation or other suitable insulation, or a combination of any of these materials, is disposed generally between the heating element 51 and the wall of the upper pull chamber 29 to inhibit cooling of the heating element by the water cooled side wall.

The heating element 51 is constructed of a non-contaminating resistive heating material which provides resistance to the flow of electrical current therethrough; the power output generated by the heating element increasing with the electrical resistance of the material. A particularly preferred resistive heating material is silicon carbide coated graphite. However, the heating element 51 may be constructed of highly purified extruded graphite, isomolded graphite, carbon fiber composite, tungsten, metal or other suitable materials without departing from the scope of this invention. It is also contemplated that the heating element 51 may be constructed of wire, such as tungsten or molybdenum wire, wrapped on a quartz tube to form a heating coil (not shown). The spacing between the coils may be varied, with the spacing becoming more narrow toward the top of the heating element, to shape the power output profile of the heating element 51. The heating element 51 is preferably capable of radiating heat at a temperature in the range of 1000° C.–1100° C.

Still referring to FIG. 2, the heating segments 55 of the heating element 51 are of varying lengths, with the upper ends 57 of the segments being co-planar about the circumference of the heating element at the top of the heating element and the lower ends 59 of the segments being staggered vertically with respect to each other because of the varying lengths of the segments. The lower ends 59 of the longest segments 65 define the bottom of the heating element 51. As an example, the heating segments 55 of the heating element 51 shown in FIG. 1 are of eight different lengths. The shortest segments 67 extend down to approximately 71 mm below the top of the heating element 51 while the longest segments 65 extend down to approximately 400 mm below the top of the heating element. Thus, it will be seen that the first 71 mm of each heating segment 55 extending downward from the top is radially opposite a portion of the crystal ingot I so that the heating element 51 surrounds substantially the entire circumference of the ingot near the top of the heating element. In contrast, the longest heating segments 65 are in radially opposed relation with the ingot I over only about 1/8 of the circumference of the crystal ingot near the bottom of the heating element 51. Thus, it may be seen that the heating element 51 radiates more heat to the crystal at its top than at its bottom.

The cross-sectional areas of the heating segments 55 are substantially equal along the height of the segments so that the resistance is generally constant throughout the heating element 51. Thus, the temperature of the heat radiated by the heating element 51 is generally uniform. For example, the heating element 51 of the present invention is preferably capable of radiating heat at a temperature in the range of about 1000° C.–1100° C. because it is desirable to reduce the cooling rate of the ingot above 1000° C., and more particularly in the 1100° C. to 1000° C. range. It is also desirable not to overheat the ingot to the extent the ingot is reheated. However, it is understood that the temperature may fall outside this range, depending on the desired cooling rate of the ingot, without departing from the scope of this invention. Due to the varying lengths of the heating segments 55, the heating power output gradually decreases toward the bottom of the heating element.

Figure 6:
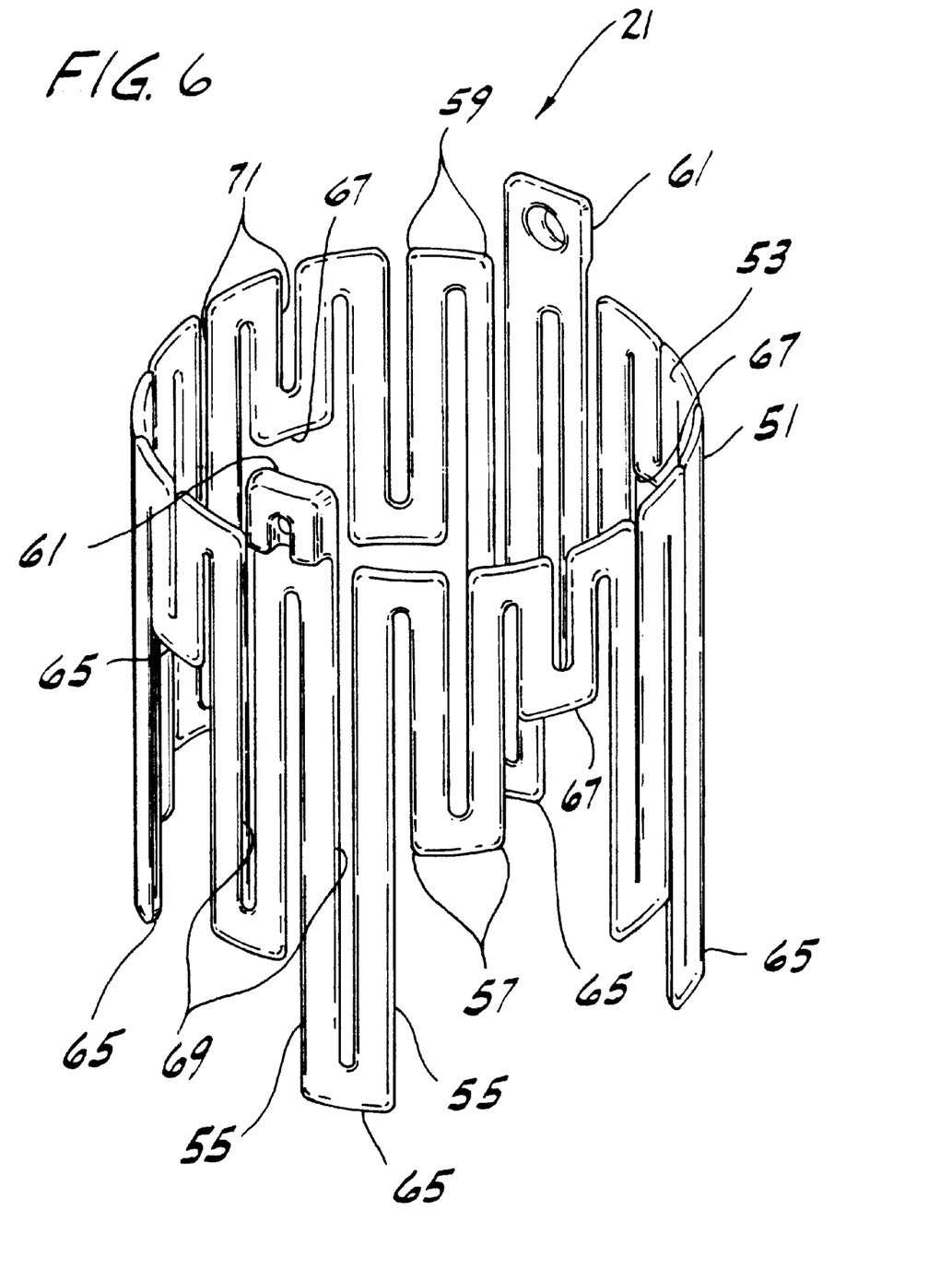
FIG. 6 is perspective view of a second embodiment of the electrical resistance heater of the present invention.

In the illustrated embodiment, the segments 55 are arranged with the shortest segments 67 disposed on one side of the heating element 51 and the longest segments 65 disposed on the opposite side of the heating element, with the intermediate segments gradually increasing in length between the shortest and longest segments. FIG. 6 shows an alternative embodiment of an electrical resistance heater 21 of the present invention in which the heating element 51 comprises heating segments 55 of four different lengths ranging from 104 mm to 350 mm. The segments 55 are arranged so that segments of the same length are equally spaced apart about the circumference of the heating element 51. It is also contemplated that heating segment 55 configurations other than those shown in FIGS. 2 and 6 may be used without departing from the scope of this invention, as long as the heating element 51 is profiled so that the heating power output increases from the bottom of the heater 21 to the top.

In a preferred method of construction of the heating element 51, portions of a tube (not shown) formed of the resistive heating material are cut away to generally define the stepped configuration of the lower ends 59 of the heating segments 55. Vertically extending slots 69, 71 are then cut into the tube to define the serpentine configuration. Downward extending slots 69 extend down from the top of the heating element 51 and terminate short of the lower ends 59 of the segments 55, leaving adjacent segments connected to each other at the lower ends. Upward extending slots 71 extend up from the lower ends 59 of the segments 55 and terminate short of the top of the heating element 51, leaving adjacent segments connected to each other at the upper ends 57 of these segments. Alternating the downward and upward extending slots 69, 71 about the circumference of the heating element 51 creates the serpentine configuration of the heating element.

In operation, polycrystalline silicon ("polysilicon") is deposited in the crucible 31 and melted by heat radiated from the crucible heater 37. A seed crystal 49 is brought into contact with the molten silicon M and a single crystal ingot I is grown by slow extraction via the pulling mechanism. The growing ingot begins cooling at a substantial cooling rate immediately as it is pulled upward from the melt. The ingot I continues cooling at this substantial rate as it is pulled upward through the lower crystal growth chamber 27 and upper pull chamber 29. When the ingot I approaches the bottom of the heating element 51 of the heater 21, the temperature of the growing ingot has cooled from an initial temperature of about 1400° C. at the liquid-solid interface to around 1100° C. As portions of the ingot I come into radial registration with the longest segments 65, heat is radiated to these portions to reduce the rate of further cooling. As the ingot I is pulled upward through the heating element 51, the number of heating segments 55 radiating heat to the ingot gradually increases. The gradual increase in heating power uniformly counters the increased exposure of the ingot I to the cooling effects of the upper pull chamber side wall as the ingot is pulled upward to and above the top of the heating element 51, thereby maintaining the cooling rate of the ingot at a generally uniform rate.

Figure 3:
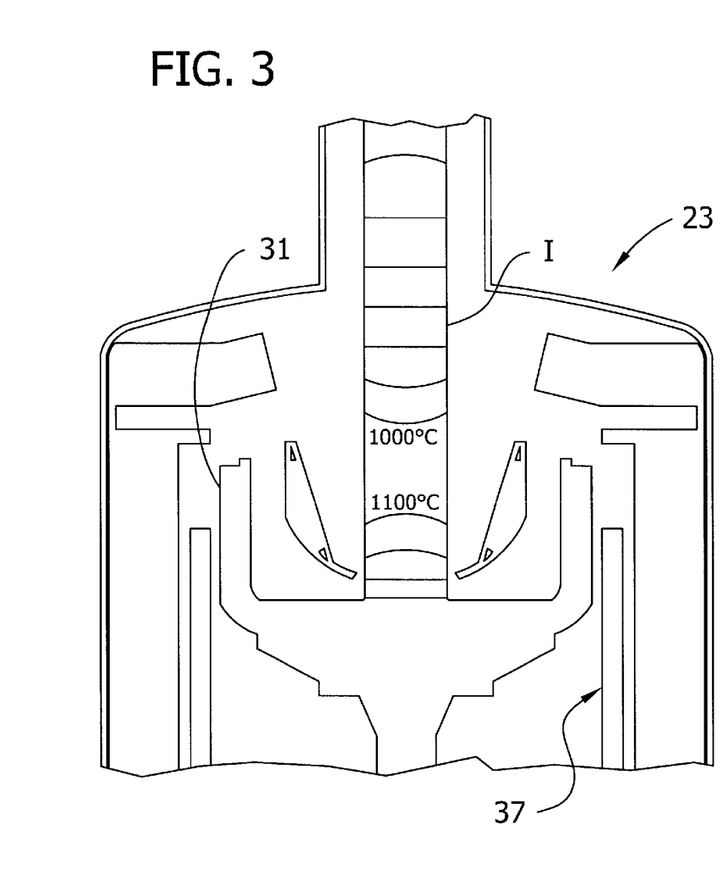
FIG. 3 is a schematic vertical section of a crystal puller showing temperature isotherms of a growing crystal developed using a finite element analysis without the electrical resistance heater of the present invention.
Figure 4:
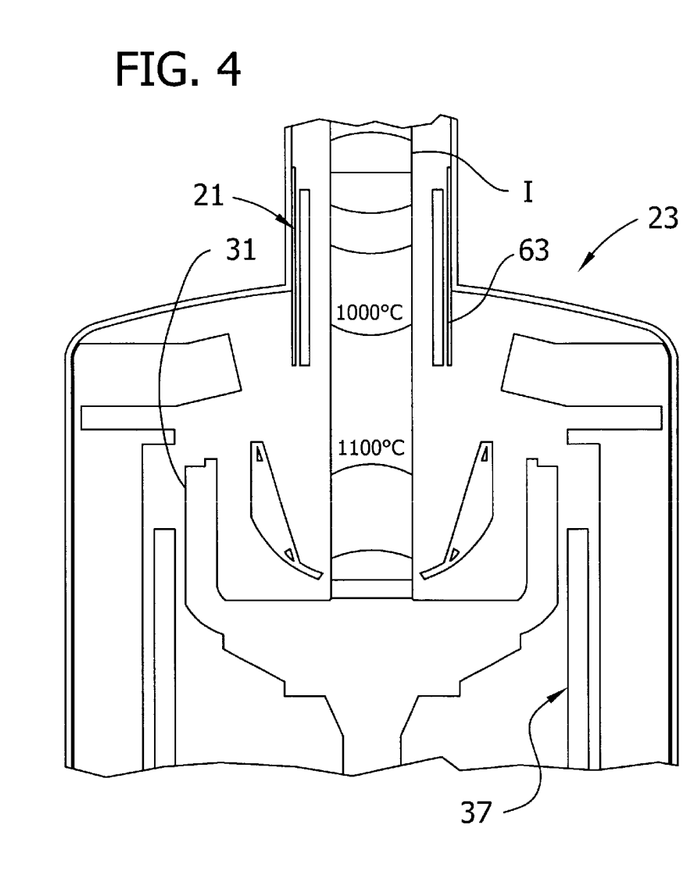
FIG. 4 is a schematic vertical section of a crystal puller showing temperature isotherms of a growing crystal developed using a finite element analysis including the electrical resistance heater of the present invention.

As an example, a finite element model analysis was conducted to simulate the growth of a pair of monocrystalline silicon ingots I according to the Czochralski method in a crystal puller 23 of the type described above. Growth of the first ingot I was simulated without the heater 21 of the present invention in the upper pull chamber 29 of the puller housing 25. An electrical resistance heater 21 of the present invention was modeled to simulate the growth of the second ingot I. With reference to FIGS. 3 and 4, in each case the temperature of the growing ingot I was recorded along the height of the ingot and isotherms were plotted to indicate the cooling pattern of the ingots. In FIG. 3 (corresponding to the ingot grown without the additional heater in the upper pull chamber) the isotherms above 1000° C. are relatively close together, indicating a rapid cooling rate of the ingot I. When the heater 21 of the present invention is used, as shown in FIG. 4, the isotherms are spaced further apart, particularly in the range of 1000°–1100° C., indicating the desired slower cooling rate of the ingot I.

Figure 5:
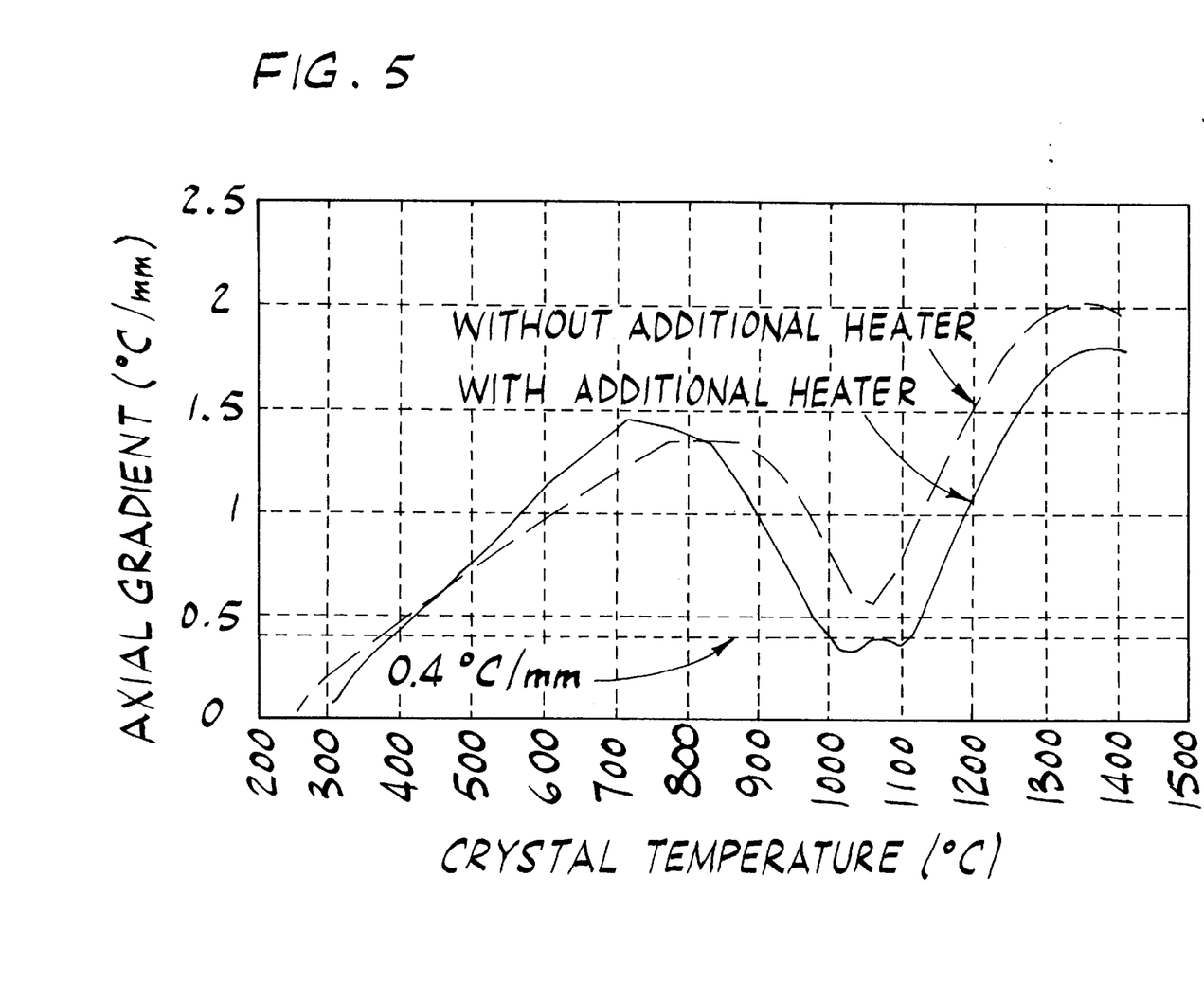
FIG. 5 is a plot of the axial temperature gradient of a crystal ingot versus the temperature of the ingot for a finite element analysis.

In addition, the axial temperature gradient of the growing ingot I was recorded and plotted versus the temperature of the growing ingot. The results are shown in FIG. 5. In the desired temperature range between 1100° C. and 1000° C., the axial temperature gradient for the ingot I grown in the puller 23 having the additional heater 21 was reduced after solidification to about 0.4° C./mm, which is substantially less than the axial temperature gradient of the ingot grown in the puller having no additional heater. Moreover, when the heater 21 of the present invention was incorporated, the axial temperature gradient remained generally uniform at about 0.4° C./mm throughout the desired temperature range.

It will be observed from the foregoing that the electrical resistance heater 21 described herein satisfies the various objectives of the present invention and attains other advantageous results. Providing a profiled heating element 21 mounted in the upper chamber 29 of the crystal puller housing 25 in which the heating segments 55 have different lengths extending down into the crystal growth chamber 27 generates an increasing heating power output profile from the bottom to the top of the heater 21. The amount of heat radiated to the growing ingot I therefore increases as the ingot is pulled upward through the heating element 51. This results in a reduction of the cooling rate of the ingot down to a desired cooling rate and then maintains a relatively uniform axial temperature gradient of the ingot through the desired temperature range of 1100° C.–1000° C.

Maintaining a constant axial temperature gradient at about 0.4° C./mm in this temperature range provides advantages over a temperature gradient that drops to a generally spiked valley below 0.4° C./mm prior to increasing again after the ingot I cools beyond 1000° C. Particularly, where the axial temperature gradient of the ingot I drops down to a spiked valley, such as below 0.4° C./mm, it takes longer for the cooling rate to increase again after the temperature of the ingot cools to 1000° C. This results in an increased risk of further agglomeration of the vacancies, thereby having a potentially negative effect on the GOI of the ingot. By using the heater 21 of the present invention, a slightly higher but uniform axial temperature gradient is maintained throughout the desired cooling range. Thus, the controlling of vacancy agglomeration is attained while simultaneously reducing the amount of time needed to increase the cooling rate once the temperature of the ingot has cooled beyond 1000° C. The substantially reduced cooling rate above 1000° C. allows sufficient time for radial out-diffusion of self-interstitials from the ingot to suppress the concentration below the critical concentration required for agglomeration of interstitial defects.

As various changes could be made in the above constructions without departing from the scope of the invention, it is intended that all matter contained in the above description or shown in the accompanying drawings shall be interpreted as illustrative and not in a limiting sense.

What is claimed is:

1. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element; said heating element including first and second vertically oriented heating segments arranged in a generally side-by-side relationship and being electrically connected together, said segments each having an upper end and a lower end, the second segment having a length substantially greater than the first segment and being arranged relative to the first segment so that when the heating element is placed in the housing the lower end of the second segment is disposed closer to the molten silicon in the crucible than the lower end of the first segment.

2. A heater as set forth in claim 1 wherein the upper ends of the first and second segments are generally co-planar at the upper end of the heating element, the lower end of the second segment being coincident with the lower end of the heating element.

3. A heater as set forth in claim 2 wherein the heating element comprises a plurality of segments disposed in a closed geometrical arrangement and electrically connected together for conducting an electric current around the heating element, the segments being constructed of an electrically resistant material so that heat is generated by the resistance of the segments to the flow of electrical current therethrough.

4. A heater as set forth in claim 3 wherein the heating element is constructed of a silicon carbide coated graphite material.

5. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element, said heating element being sized and shaped to extend around at least a portion of the circumference of the crystal ingot when placed in the crystal puller, the upper end of the heating element being sized and shaped to surround a substantially greater extent of the circumference of the ingot than the lower end of the heating element.

6. A heater as set forth in claim 5 in combination with the crystal puller.

7. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element, said heating element having the shape of a tube cut by a plane oblique to the longitudinal axis whereby when placed in the housing the upper end of the heating element extends around the entire circumference of the ingot and the lower end of the heating element extends around substantially less than the entire circumference of the ingot.

8. A crystal puller for growing monocrystalline silicon ingots according to the Czochralski method, the crystal puller comprising:

a housing;

a crucible in the housing for containing molten silicon;

a pulling mechanism for pulling a growing ingot upward from the molten silicon; and an electrical resistance heater comprising a heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element and being further constructed such that power input to the heating element is substantially uniform throughout the heating element.

9. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element and being further constructed such that power input to the heating element is substantially uniform throughout the heating element.

10. An electrical resistance heater for use in a crystal puller used for growing monocrystalline silicon ingots according to the Czochralski method, the crystal puller having a housing, a crucible in the housing for containing molten silicon and a pulling mechanism for pulling a growing ingot upward from the molten silicon, the heater comprising a unitary heating element sized and shaped for placement in the housing of the crystal puller generally above the crucible in spaced relationship with the outer surface of the growing ingot for radiating heat to the ingot as it is pulled upward in the housing relative to the molten silicon, the heating element having an upper end and a lower end, the lower end of the heating element being disposed substantially closer to the molten silicon than the upper end when the heating element is placed in the housing, said heating element being constructed such that the heating power output generated by the heating element gradually increases from the lower end to the upper end of the heating element and having a substantially uniform resistivity throughout the heating element.

* * * * *